United States Patent
Jeon et al.

(10) Patent No.: US 8,697,570 B2
(45) Date of Patent: Apr. 15, 2014

(54) SEMICONDUCTOR DEVICE INCLUDING CONTACT PLUG AND METHOD OF MANUFACTURING THE SAME

(75) Inventors: Taek-soo Jeon, Yongin-si (KR); Bong-hyun Kim, Incheon (KR); Won-seok Yoo, Hwaseong-si (KR); Jae-hong Seo, Yongin-si (KR); Ho-kyun An, Wonju-si (KR); Dae-hyun Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 593 days.

(21) Appl. No.: 12/941,331

(22) Filed: Nov. 8, 2010

(65) Prior Publication Data

US 2011/0198758 A1   Aug. 18, 2011

(30) Foreign Application Priority Data

Feb. 17, 2010  (KR) .......................... 10-2010-0014244

(51) Int. Cl.
 *H01L 21/4763* (2006.01)
(52) U.S. Cl.
 USPC .................................. 438/647; 257/E21.585
(58) Field of Classification Search
 USPC .......................... 438/637, 657, 672, 675, 647; 257/E21.575, E27.084, E27.089, 257/E21.657, E21.658, E21.585
See application file for complete search history.

(56) References Cited

U.S. PATENT DOCUMENTS

| | | | | |
|---|---|---|---|---|
| 5,960,282 A | * | 9/1999 | Chuang | 438/255 |
| 6,136,646 A | * | 10/2000 | Linliu et al. | 438/255 |
| 7,479,452 B2 | * | 1/2009 | Chien | 438/672 |
| 2004/0036125 A1 | * | 2/2004 | Oh et al. | 257/382 |
| 2005/0087510 A1 | * | 4/2005 | Han et al. | 216/13 |
| 2010/0255664 A1 | * | 10/2010 | Khandekar et al. | 438/488 |

FOREIGN PATENT DOCUMENTS

| | | |
|---|---|---|
| JP | 08330423 | 12/1996 |
| KR | 1020030001642 A | 1/2003 |
| KR | 1020070062868 A | 6/2007 |

OTHER PUBLICATIONS

English translation Jp08-330423—Hirota et al.*

* cited by examiner

*Primary Examiner* — Daniel Luke
*Assistant Examiner* — Latanya N Crawford
(74) *Attorney, Agent, or Firm* — Volentine & Whitt, PLLC

(57) ABSTRACT

A semiconductor device includes a substrate having a conductive area, a first pattern formed on the substrate and having a contact hole through which the conductive area is exposed, and a contact plug in the contact hole. The contact plug includes first and second silicon layers. The first silicon layer, formed from a first compound including at least two silicon atoms, is formed in the contact hole to contact a top surface of the conductive area and a side wall of the first pattern. The second silicon layer, formed from a second compound including a number of silicon atoms less than the number of the silicon atoms of the first compound, is formed on the first silicon layer and fills a remaining space of the contact hole, the second silicon layer being spaced apart from the first pattern at an entrance of the contact hole.

16 Claims, 21 Drawing Sheets

US 8,697,570 B2

SEMICONDUCTOR DEVICE INCLUDING CONTACT PLUG AND METHOD OF MANUFACTURING THE SAME

CROSS-REFERENCE TO RELATED APPLICATIONS

A claim of priority is made to Korean Patent Application No. 10-2010-001424, filed on Feb. 17, 2010, in the Korean Intellectual Property Office, the subject matter of which is hereby incorporated by reference.

BACKGROUND

Embodiments of the inventive concept relate to a semiconductor device and a method of manufacturing the same, and more particularly, to a semiconductor device including a contact plug and a method of manufacturing the semiconductor device.

As the degree of integration of semiconductor devices increases, design rule parameters for elements included in the semiconductor devices decrease. For example, in semiconductor devices requiring a large number of transistors, a gate length, which is one of the design rule parameters, decreases, the size of a contact hole for electrically connecting conductive layers of different levels decreases, and an aspect ratio increases.

SUMMARY

An embodiment of the inventive concept provides a semiconductor device including a contact plug that is small enough to scale down the semiconductor device and has no seam or void that would increase contact resistance.

An embodiment of the inventive concept also provides a method of manufacturing a semiconductor device including a contact plug that is small enough to scale down the semiconductor device, and that has electrical characteristics sufficient to fill a contact hole with a conductive material without a seam or void that would increase contact resistance.

According to an aspect of the inventive concept, there is provided a semiconductor device including a substrate having a conductive area, a first pattern formed on the substrate and having a contact hole through which the conductive area is exposed, and a contact plug in the contact hole. The contact plug includes first and second silicon layers. The first silicon layer is formed from a first compound including at least two silicon atoms, and is formed in the contact hole to contact a top surface of the conductive area and a side wall of the first pattern. The second silicon layer is formed from a second compound including a number of silicon atoms less than the number of the silicon atoms of the first compound, and is formed on the first silicon layer, filling a remaining space of the contact hole, the second silicon layer being spaced apart from the first pattern at an entrance of the contact hole.

The first compound may be represented by $Si_nH_{2n+2}$, where n is a natural number satisfying $2=n=10$. The second compound may be $SiH_4$, for example.

Each of the first silicon layer and the second silicon layer may further include a first conductive-type impurity. The first conductive-type impurity may be an N-type impurity or a P-type impurity. The first pattern may be formed of conductive polysilicon.

According to another aspect of the inventive concept, there is provided a method of manufacturing a semiconductor device. The method includes forming a first pattern on a semiconductor substrate, the first pattern having a contact hole through which a top surface of a conductive area of the semiconductor substrate is exposed; forming a first silicon layer on the exposed top surface of the conductive area and on a side wall of the first pattern to partially fill the contact hole, the first silicon layer being formed using a first compound having at least two silicon atoms; and forming a second silicon layer on the first silicon layer to fill a remaining space of the contact hole, the second silicon layer being formed using a second compound having fewer silicon atoms than the first compound.

The first compound may be represented by $Si_nH_{2n+2}$, where n is a natural number satisfying $2=n=10$. The first compound may be $Si_2H_6$, and the second compound may be $SiH_4$, for example.

Each of the first silicon layer and the second silicon layer may be formed by chemical vapor deposition (CVD). The forming of the second silicon layer may include forming the second silicon layer in situ in a reaction chamber used to form the first silicon layer.

The forming of the first silicon layer may include simultaneously supplying the first compound and a first dopant source to the semiconductor substrate. The forming of the second silicon layer may include simultaneously supplying the second compound and a second dopant source to the semiconductor substrate.

The forming of the first silicon layer may include forming the first silicon layer at a first temperature and the forming of the second silicon layer may include forming the second silicon layer at a second temperature that is higher than the first temperature. The first temperature may be in a range of about 350° C. to about 550° C., for example.

The first pattern may include a conductive polysilicon layer. The first silicon layer may be formed in the contact hole to directly contact the conductive area and the first pattern. The method may further include partially removing the first silicon layer and the second silicon layer, and forming a contact plug including remaining portions of the first silicon layer and the second silicon layer remaining in the contact hole. A conductive layer is formed to cover the contact plug and the first pattern.

The first pattern may include an insulating layer. The method may further include forming an insulating spacer in the contact hole along a side wall of the first pattern, where the first silicon layer is formed in the contact hole to directly contact the conductive area and the insulating spacer.

According to another aspect of the inventive concept, there is provided a method of manufacturing a semiconductor device. The method includes forming a conductive polysilicon layer on a semiconductor substrate, the conductive polysilicon layer having a contact hole through which a conductive area on the semiconductor substrate is exposed; forming a first contact conductive layer on the conductive polysilicon layer and the conductive area exposed through the contact hole using a chemical vapor deposition (CVD) process using a first dopant source and a first silicon source formed of a compound comprising at least two silicon atoms; and forming a second contact conductive layer on the first contact conductive layer, filling a remaining space of the contact hole around an entrance of the contact hole, using a CVD process using a second dopant source and a second silicon source formed of a compound having fewer silicon atoms than the compound of the first silicon source. The first contact conductive layer and the second contact conductive layer are partially removed to form a contact plug, which includes remaining portions of the first contact conductive layer and the second contact conductive layer remaining in the contact hole.

BRIEF DESCRIPTION OF THE DRAWINGS

The embodiments of the inventive concept will be described with reference to the attached drawings, in which.

DETAILED DESCRIPTION OF THE EMBODIMENTS

Figure 1:
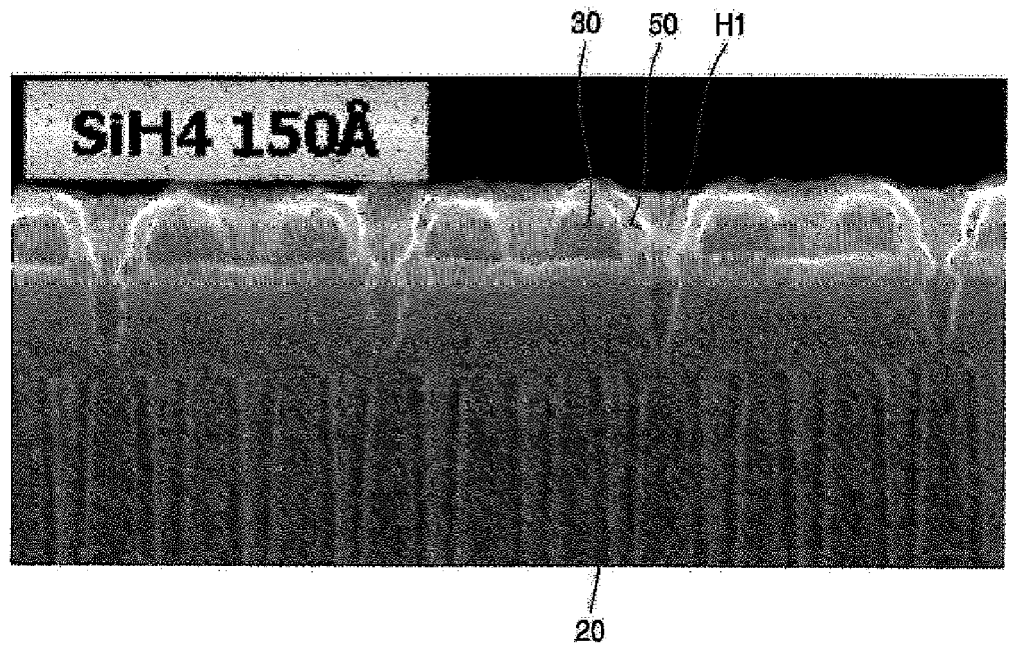
FIG. 1 is an image illustrating a silicon layer formed in a hole, through which a conductive polysilicon layer pattern and an oxide layer pattern are exposed, using a chemical vapor deposition (CVD) process, by using a silicon source formed of a compound including one silicon atom.

The invention concept will now be described more fully with reference to the accompanying drawings, in which exemplary embodiments of the inventive concept are shown. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Various elements and regions are schematically illustrated in the drawings, although the inventive concept is not limited to sizes or intervals shown in the drawings. Unless otherwise noted, like reference numerals denote like elements throughout the attached drawings and written description.

In order to increase the degree of integration of semiconductor devices, design rule parameters, such as gate line widths of transistors and distances between the transistors, should be reduced. Accordingly, line widths of wiring patterns for electrically connecting the transistors and distances between the wiring patterns are also reduced.

For example, a contact plug may be formed to electrically connect source/drain regions of the transistors to bit lines formed over the source/drain regions. Due to the increased degree of integration of the semiconductor device, a contact hole in which the contact plug is to be formed is very small and has a high aspect ratio. There is a demand for a technology for filling the small contact hole with a conductive material without creating a seam or void.

Thus, according to various embodiments, a contact hole is filled with a silicon-containing material using a chemical vapor deposition (CVD) process, where a silicon layer is exposed through the contact hole. The contact hole is filled with the silicon-containing material in ways that vary according to the type of silicon source used to form the silicon-containing material.

FIG. 1 is an image illustrating a case in which a silicon layer 50 is formed to a target thickness of about 150 Å in a hole H1, through which a conductive polysilicon layer pattern 20 and an oxide layer pattern 30 are exposed, using a CVD process, in which a $SiH_4$ gas is used as a silicon source gas. The $SiH_4$ gas is a compound including one silicon atom.

When the $SiH_4$ gas is used, the silicon source tends to heavily deposit around an interface between the conductive polysilicon layer pattern 20 and the oxide layer pattern 30. This is because silicon atoms of the $SiH_4$ gas generally migrate to an area around. the interface between the conductive polysilicon layer pattern 20 and the oxide layer pattern 30, and thus a larger number of silicon atoms deposit around the interface than other areas. The tendency becomes stronger as the number of silicon atoms included in the compound, e.g., $SiH_4$, constituting the silicon source decreases. Due to the heavy deposition around the interface, a poor silicon seed is formed at an initial stage of the process of forming the silicon layer 50. As a result, the silicon layer 50 has poor surface roughness. In particular, when silicon atoms excessively deposit around the interface between the conductive polysilicon layer pattern 20 and the oxide layer pattern 30 as compared to other areas, as shown in FIG. 1, subsequent deposition may form an overhang at the entrance of the hole H1. Thus, the entrance of the hole H1 may close before the hole H1 is completely filled, resulting in a seam or void in the hole H1. A contact plug with such a seam or void may increase contact resistance.

In contrast, when a silicon layer is formed in a hole using a CVD process, in which the silicon source gas is a compound including two or more silicon atoms instead of one silicon atom, such as $SiH_4$, for example, no overhang is formed around an interface between a conductive polysilicon layer pattern and an oxide layer pattern in the hole. A silicon layer having excellent surface roughness is thus obtained.

Figure 2:
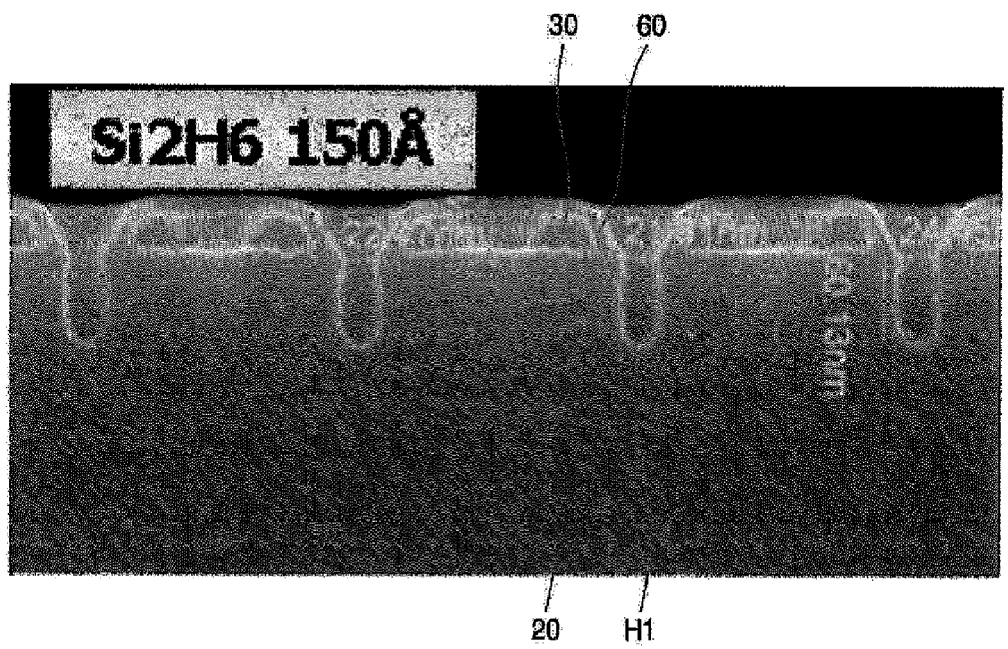
FIG. 2 is an image illustrating a silicon layer formed in a hole, through which a conductive polysilicon layer pattern and an oxide layer pattern are exposed, using a CVD process, by using a silicon source formed of a compound including two silicon atoms.

FIG. 2 is an image illustrating a case in which a silicon layer 60 is formed to a target thickness of about 150 Å in the hole H1, through which the conductive polysilicon layer pattern 20 and the oxide layer pattern 30 are exposed, using a CVD process in which a $Si_2H_6$ gas is used as the silicon source gas. The $Si_2H_6$ gas is a compound including two silicon atoms.

When the $Si_2H_6$ gas is used, the silicon source does not tend to heavily deposit around an interface between the conductive polysilicon layer pattern 20 and the oxide layer pattern 30, and a silicon seed is uniformly formed over the entire area in the hole H1. Accordingly, when the silicon layer 60 is formed in the hole H1 using the $Si_2H_6$ gas, an abnormally large seed is prevented from being formed around the interface between the conductive polysilicon layer pattern 20 and the oxide layer pattern 30, and excellent surface roughness is achieved. This avoids an undesirable structure that includes a seam or void in the hole H1.

Methods of forming a contact plug without a seam or void, according to embodiments of the inventive concept, will now be explained. The methods generally prevent an overhang from being formed due to an abnormally large seed in a contact hole when the contact hole is filled with a silicon layer in a state where the silicon layer is exposed through the contact hole.

FIGS. 3A through 3F are cross-sectional views illustrating a method of manufacturing a semiconductor device, according to an embodiment of the inventive concept.

Figure 3A:
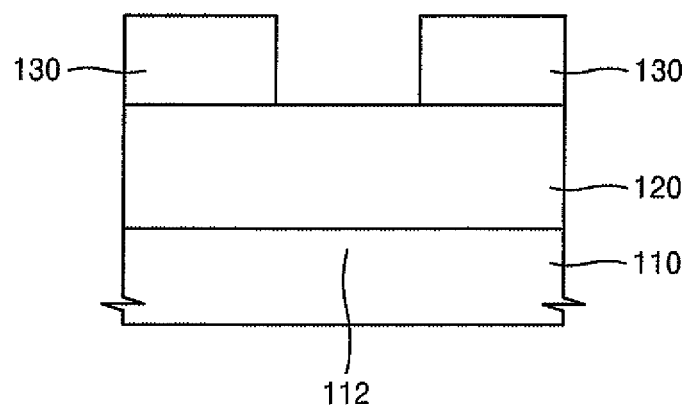
FIGS. 3A through 3F are cross-sectional views illustrating a method of manufacturing a semiconductor device, according to an embodiment of the inventive concept.

Referring to FIG. 3A, a silicon layer 120 is formed on a substrate 110, which includes a conductive area 112. A mask pattern 130 is formed on the silicon layer 120.

The substrate 110 may be a semiconductor substrate, such as a silicon substrate, for example. The conductive area 112 may be an impurity area formed in the substrate 110, for example. Alternatively, the conductive area 112 may be a contact pad or a conductive line for electrically connecting conductive layers of different levels.

The silicon layer 120 may be a conductive or non-conductive polysilicon layer, for example. The mask pattern 130 may be formed of a material having an etch selectivity different from that of the silicon layer 120. For example, the mask pattern 130 may be formed of a hard mask material including oxide, nitride, or a combination thereof. Alternatively, the mask pattern 130 may be a photoresist pattern.

Figure 3B:
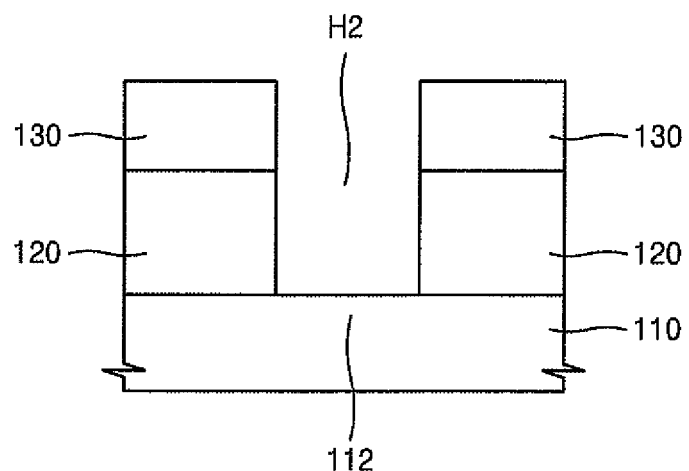

Referring to FIG. 3B, the silicon layer 120 is etched using the mask pattern 130 as an etch mask to form a contact hole 112, through which the conductive area 112 is exposed. Side walls of the silicon layer 120 and the mask pattern 130 are thus exposed through the contact hole H2.

Figure 3C:
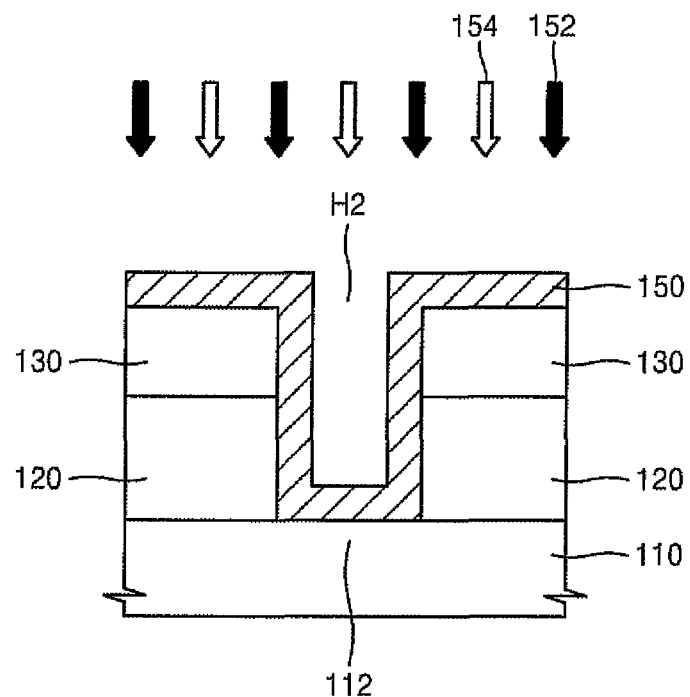

Referring to FIG. 3C, a purging process is performed using a purging gas, such as a $N_2$ gas, on a resultant structure with the contact hole H2. Then, a first conductive silicon layer 150 is formed in the contact hole H2 using a CVD process that uses a first silicon source 152 formed of a compound having at least two silicon atoms.

The first conductive silicon layer 150 covers a top surface of the conductive area 112 exposed through the contact hole H2, the side wall of the silicon layer 120 exposed through the contact hole 112, and the side wall and a top surface of the mask pattern 130. The first conductive silicon layer 150 is formed to partially fill the contact hole H2.

In order to form the first conductive silicon layer 150, the CVD process may be performed by simultaneously supplying a first dopant source 154 and the first silicon source 152 formed of the compound including the at least two silicon atoms to the substrate 110 with the contact hole 112 in a reaction chamber, e.g., a CVD reaction chamber. During the CVD process, the reaction chamber may be maintained at a relatively low temperature of about 350° C. to about 550° C. and a pressure atmosphere of about 50 Pa to about 200 Pa, for example.

In various embodiments, a compound represented by $Si_nH_{2n+2}$ (where n is a natural number satisfying 2=n=10) may be used as the first silicon source 152. For example, $Si_2H_6$ gas, $Si_3H_6$ gas, or $Si_4H_8$ gas, each of which includes two or more silicon atoms, may be used as the first silicon source 152. The first dopant source 154 may be an N-type impurity source, such as $PH_3$ or $AsH_3$, or a P-type impurity source, such as $BF_3$ or $BCl_3$, for example.

Because the first conductive silicon layer 150 is formed using the first silicon source 152, which is a compound including the at least two silicon atoms, an abnormally large seed is not formed around an interface between the silicon layer 120 and the mask pattern 130, the side walls of which are exposed through the contact hole 112. Also, the first conductive silicon layer 150 formed in the contact hole H2 has excellent surface roughness.

Figure 3D:
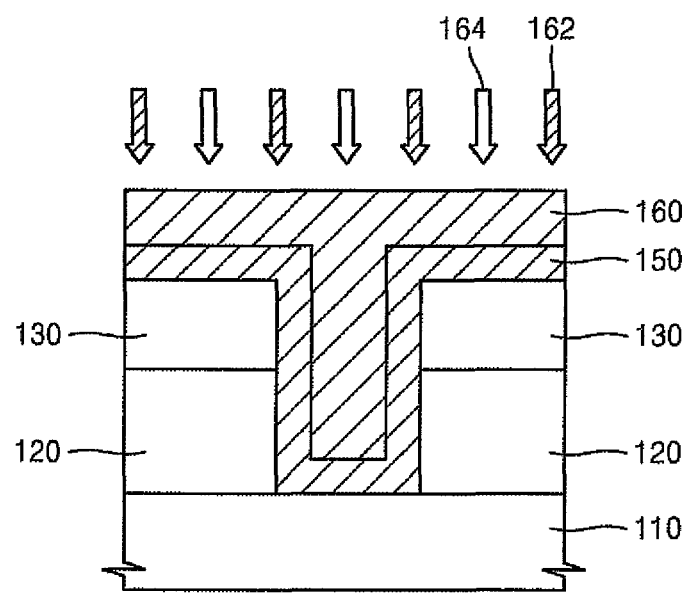

Referring to FIG. 3D, a second conductive silicon layer 160 is formed on the first conductive silicon layer 150 until the contact hole H2 is completely filled, using a second silicon source 162. The second silicon source 162 is formed of a compound having a number of silicon atoms that is less than the number of silicon atoms in the compound forming the first silicon source 152 of FIG. 3C. For example, the second silicon source 162 may be $SiH_4$. in the present example. The second conductive silicon layer 160 may be formed in situ in the reaction chamber used to form the first conductive silicon layer 150, described above with reference to FIG. 3C.

In order to form the second conductive silicon layer 160, a CVD process may be performed by simultaneously supplying a second dopant source 164 and the second silicon source 162 to the first conductive silicon layer 150. For example, the CVD process may be performed in the reaction chamber in which the forming of the first conductive silicon layer 150 was performed.

During the CVD process, the reaction chamber may be maintained at a temperature of about 450° C. to about 580° C., for example. The process temperature at which the second conductive silicon layer 160 is formed may be higher than the process temperature at which the first conductive silicon layer 150 is formed. For example, when the first conductive silicon layer 150 is formed, a process temperature of less than about 500° C. may be maintained, and when the second conductive silicon layer 160 is formed, a process temperature of higher than about 500° C. may be maintained. In order to form the second conductive silicon layer 160, the reaction chamber may be maintained at a pressure of about 50 Pa to about 200 Pa, for example.

The second dopant source 164 may be an N-type impurity source, such as $PH_3$ or $AsH_3$, or a P-type impurity source, such as $BF_3$ or $BCl_3$, for example. The second dopant source 164 may be formed of the same material as that of the first dopant source 162.

As stated above, in order to completely fill the contact hole H2 in which the first conductive silicon layer 150 is partially formed, the second conductive silicon layer 160 is formed using the second silicon source 162, which is formed of a compound that includes fewer silicon atoms than the compound forming the first silicon source 152. Accordingly, the second conductive silicon layer 160 has excellent step coverage characteristics.

Figure 3E:
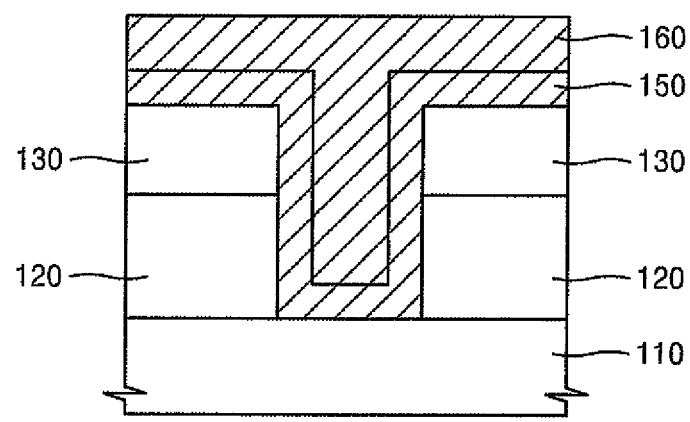

Referring to FIG. 3E, a purging process is performed by using a purging gas, such as an $N_2$ gas, on a resultant structure with the second conductive silicon layer 160.

The first conductive silicon layer 150 and the second conductive silicon layer 160 may be in amorphous states. In this case, the first conductive silicon layer 150 and the second conductive silicon layer 160 may be phase-changed into polycrystalline states by performing heat treatment on the resultant structure including the first conductive silicon layer 150 and the second conductive silicon layer 160.

Figure 3F:
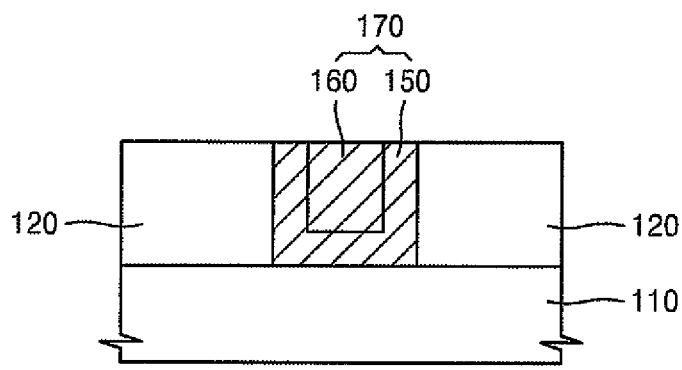

Referring to FIG. 3F, a contact plug 170 is formed by partially removing the first conductive silicon layer 150 and the second conductive silicon layer 160 to expose the mask pattern 130, and then removing the mask pattern 130. The contact plug 170 therefore includes the remaining portions of the first conductive silicon layer 150, which partially fills the contact hole H2, and the second conductive silicon layer 160, which is formed on the first conductive silicon layer 150 and adapted to fill the remaining space of the contact hole H2 around an entrance of the contact hole 170, spaced apart from the silicon layer 120.

Partially removing the first conductive silicon layer 150 and the second conductive silicon layer 160 may be performed using an etch-back process, and removing the mask pattern 130 may be performed using a wet-etching process, for example. Alternatively, partially removing the first conductive silicon layer 150 and the second conductive silicon layer 160, and removing the mask pattern 130 may be performed using a chemical mechanical polishing (CMP) process, for example.

Because the first conductive silicon layer 150, which includes the first silicon source 152 formed of a compound including at least two silicon atoms, and the second conductive silicon layer 160, which includes the second silicon source 162 formed of a compound including fewer silicon atoms than the compound of the first silicon source 152, are sequentially formed to form the contact plug 170, the contact hole H2 is filled with a conductive material without a seam or void that would otherwise increase contact resistance.

Figure 4A:
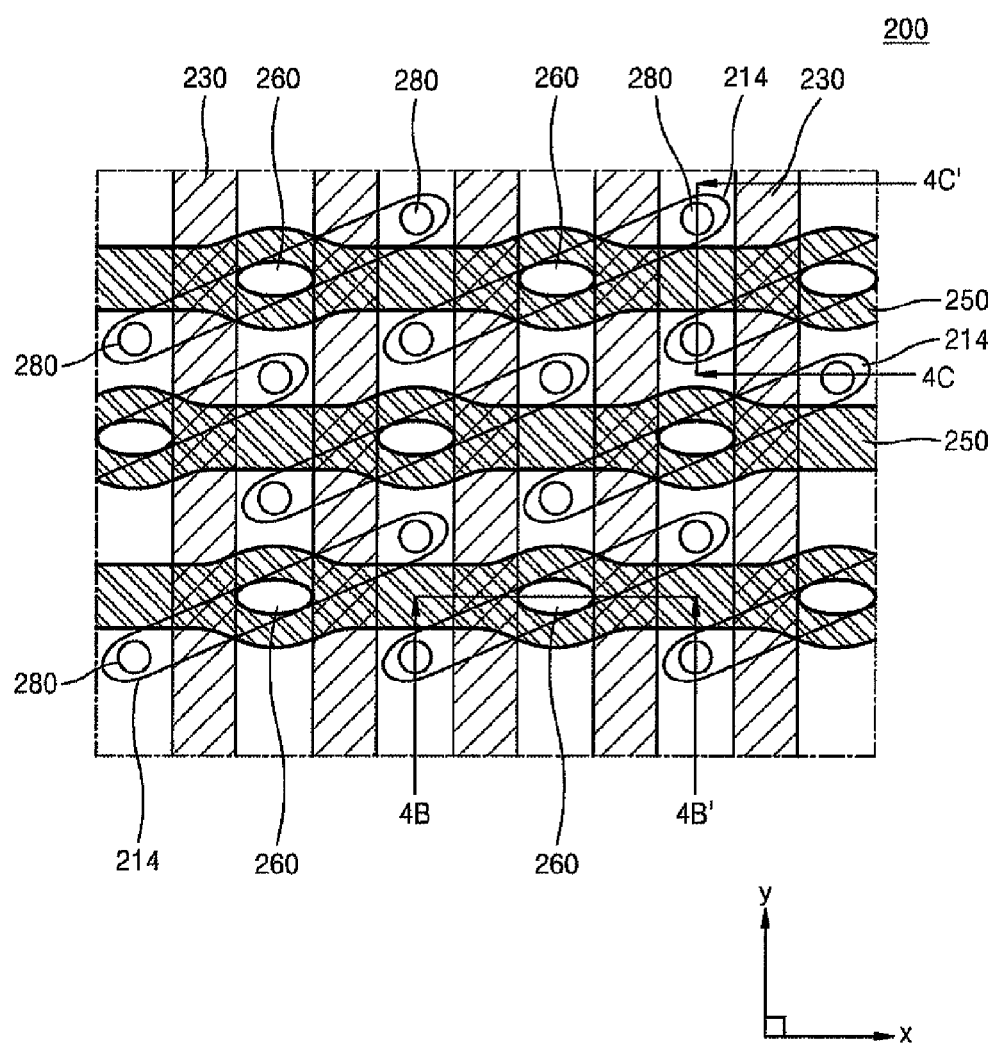
FIG. 4A is a layout of semiconductor device, according to an embodiment of the inventive concept.
Figure 4B:
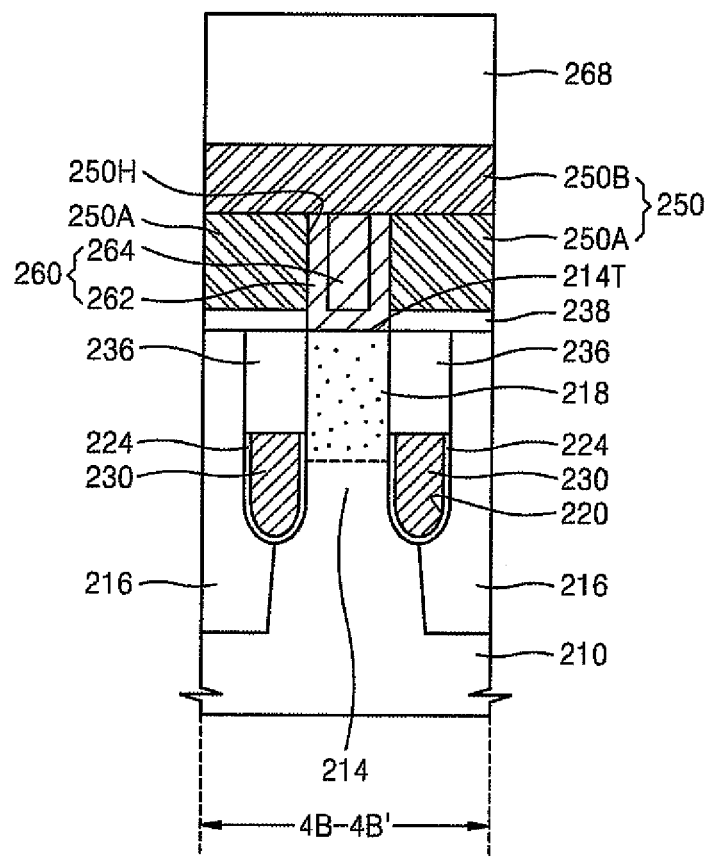
FIG. 4B is a cross-sectional view taken along line 4B-4B' of FIG. 4A.

FIG. 4A is a layout of a semiconductor device 200 according to an embodiment of the inventive concept. FIG. 4B is a cross-sectional view taken along line 4B-4B' of FIG. 4A, and FIG. 4C is a cross-sectional view taken along line 4C-4C' of FIG. 4A.

Figure 4C:
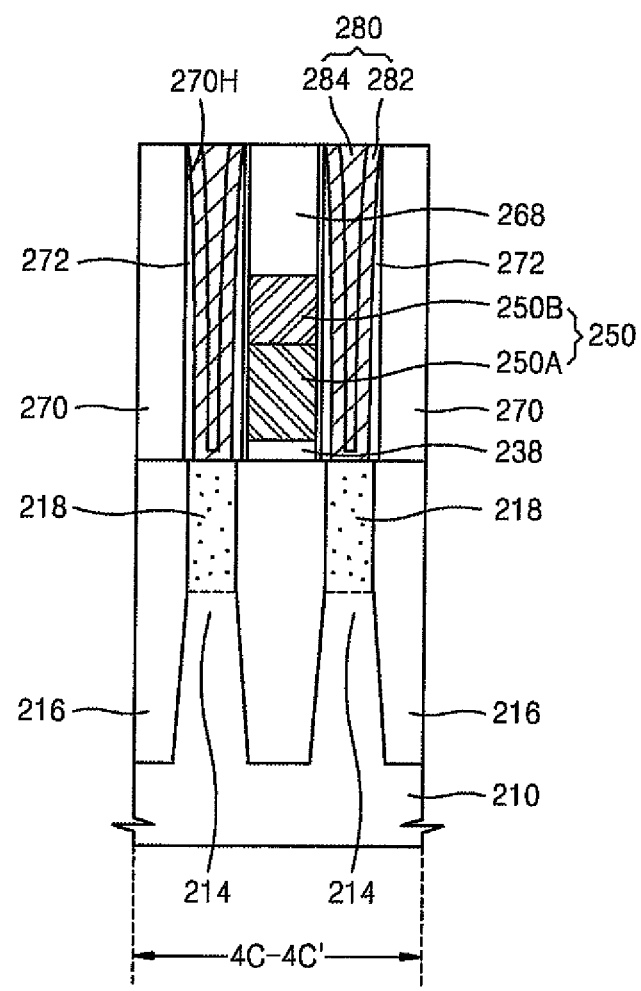
FIG. 4C is a cross-sectional view taken along line 4C-4C' of FIG. 4A.

The semiconductor device 200 illustrated in FIGS. 4A through 4C may be applied to a cell array, such as dynamic random access memory (DRAM) cell array. For example, the semiconductor device 200 may be applied to a DRAM cell array in which each DRAM cell has a unit cell size of $6F^2$, where F is a minimum feature size. However, the inventive concept is not limited thereto.

Referring to FIGS. 4A through 4C, the semiconductor device 200 includes an isolation layer 216 formed on a substrate 210 and adapted to define multiple active areas 214. The substrate 210 may be formed of a semiconductor material, such as silicon (Si).

Multiple buried word lines 230 having top surfaces that are lower than top surfaces 214T of the active areas 214 extend in a first direction (y-direction in FIG. 4A), which is parallel to the direction in which a main surface of the substrate 210 extends. The top surfaces of the buried word lines 230 are covered by a capping layer 236. The capping layer 236 may include, for example, a silicon nitride layer. A gate insulating layer 224 is formed between the buried word lines 230 and the active areas 214.

An impurity area 218 acting as a source/drain region is formed in each of the active areas 214. The impurity area 218 extends to a predetermined depth in the substrate 210 from each of the top surfaces 214T of the active areas 214.

Multiple bit lines 250 are formed over the buried word lines 230 and extend in a second direction (x-direction in FIG. 4A) perpendicular to the first direction. The bit lines 250 have a structure in which a first bit line conductive pattern 250A and a second bit line conductive pattern 250B formed of different materials are sequentially stacked. However, the various embodiments are not limited to this configuration.

The semiconductor device 200 is configured in such a manner that two buried word lines of the multiple buried word lines 230 extend in parallel in the y-direction for one active area of the multiple active areas 214. A direct contact 260 is formed between the two buried word lines for each active area 214. The direct contact 260 is formed in a contact hole 250H passing through the first bit line conductive pattern 250A of the bit line 250. The direct contact 260 is electrically connected to the impurity area 218 formed in each of the active areas 214. The bit line 250 is electrically connected to the impurity area 218 formed in each of the active areas 214 through the direct contact 260.

The direct contact 260 has a structure in which a first contact conductive layer 262 and a second contact conductive layer 264 are sequentially stacked. The first contact conductive layer 262 is formed in the contact hole 250H formed in the first bit line conductive pattern 250A and directly contacts the first bit line conductive pattern 250A and the impurity area 218 of each of the active areas 214. The second contact conductive layer 264 is formed on the first contact conductive layer 262, and fills a remaining space of the contact hole 250H.

The first contact conductive layer 262 of the direct contact 260 may be obtained from a first silicon source formed of a compound including at least two silicon atoms. The first silicon source is the same as the first silicon source 152, discussed above with reference to FIG. 3C, for example. The second contact conductive layer 264 of the direct contact 260 may be obtained from a second silicon source formed of a compound including fewer silicon atoms than the compound constituting the first silicon source. The second silicon source the same as the second silicon source 162, discussed above with reference to FIG. 3D, for example.

Two buried contacts 280 are respectively formed on both sides of the two buried word lines 230 for each of the active areas 214. Each of the buried contacts 280 is electrically connected to the impurity area 218 formed in each of the active areas 214. The buried contact 280 may electrically connect a lower electrode (not shown) of a capacitor and the impurity area 218. In particular, as shown in FIG. 4C, the buried contact 280 may be a direct buried contact that is directly connected to the impurity area 218 formed in each of the active areas 214.

The buried contact 280 has a structure in which a third contact conductive layer 282 and a fourth contact conductive layer 284 are sequentially stacked. The third contact conductive layer 282 is formed in a contact hole 270H formed in an interlayer insulating layer 270 that is formed on the substrate 210, and directly contacts the impurity area 218 formed in each of the active areas 214. An insulating spacer 272 is disposed between the interlayer insulating layer 270 and the third contact conductive layer 282. The fourth contact conductive layer 284 is formed on the third contact conductive layer 282, and fills a remaining space of the contact hole 270H.

The third contact conductive layer 282 of the buried contact 280 may be obtained from a first silicon source formed of a compound including at least two silicon atoms. The first silicon source is the same as the first silicon source 152, discussed above with reference to FIG. 3C, for example. The fourth contact conductive layer 284 may be obtained from a second silicon source formed of a compound including fewer silicon atoms than the compound constituting the first silicon source. The second silicon source is the same as the second silicon source 162, discussed above with reference to FIG. 3D, for example.

FIGS. 5A through 5G are cross-sectional views illustrating a method of manufacturing a semiconductor device, according to another embodiment of the inventive concept.

The method of FIG. 5A through 5G, including a method of forming the direct contact 260 illustrated in FIGS. 4A through 4C, will now be explained. FIGS. 5A through 5G are cross-sectional views corresponding to the cross-sectional view taken along line 4B-4B' of FIG. 4. In FIGS. 5A through 5G, the same elements as those in FIGS. 3A through 3F and 4A through 4C are denoted by the same reference numerals and detailed explanations thereof will not be repeated for clarity.

Figure 5A:
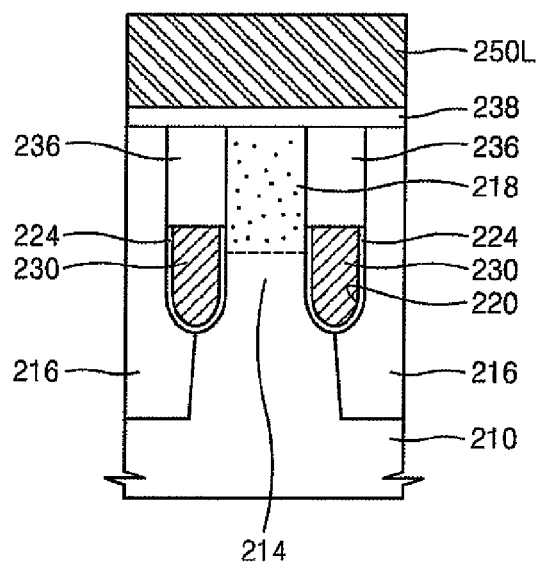
FIGS. 5A through 5G are cross-sectional views illustrating a method of manufacturing a semiconductor device, according to another embodiment of the inventive concept.

Referring to FIG. 5A, multiple trenches 220 are formed in the substrate 210 on which the active areas 214 are defined by the isolation area 216. The gate insulating layer 224 and each of the buried word lines 230 are sequentially formed in each of the trenches 220. Next, the capping layer 236 is formed on each of the buried word lines 230 to fill the remaining space in each of the trenches 220.

The gate insulating layer 224 may be a silicon oxide layer, and the buried word lines 230 may be formed of a metal, metal nitride, or polysilicon, such as titanium nitride (TiN), for example. The capping layer 236 may be formed of silicon nitride, for example.

The impurity area 218 is formed in each of the active areas 214 by injecting impurities into both sides of each of the buried word lines 230. The impurity area 218 may serve as a source/drain region. If the buried word lines 230 constitute an NMOS, an N-type impurity source, such as $PH_3$ or $AsH_3$, may be used during an ion implantation process for forming the impurity area 218. If the buried word lines 220 constitute a PMOS, a P-type impurity source, such as $BF_3$ or $BCl_3$, may be used during an ion implantation process for forming the impurity area 218.

Next, an insulating layer 238 is formed on a top surface of the substrate 210 through which the isolation layer 216, the capping layer 236, and the impurity area 218 are exposed. A lower conductive layer 250L for forming the bit line 250 is formed on the insulating layer 238. The lower conductive layer 250L may constitute the first bit line conductive pattern 250A illustrated in FIGS. 4B and 4C. The lower conductive layer 250L may be a conductive polysilicon layer, for example.

The insulating layer 238 may be a silicon oxide layer, for example. In various embodiments, the insulating layer 238 may be used as a gate insulating layer of a transistor (not shown) formed on an area other than the semiconductor device 200 (see FIG. 4A), for example, a core region (not shown) or a peripheral circuit region (not shown).

Figure 5B:
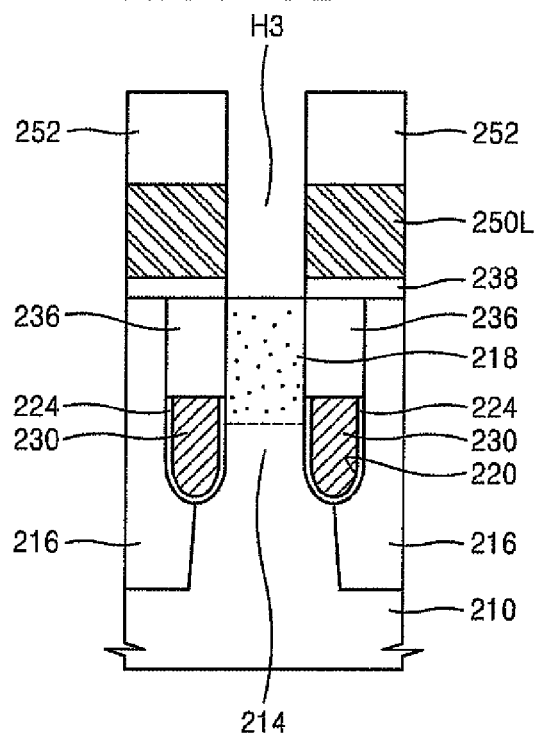

Referring to FIG. 5B, a mask pattern 252 is formed on the lower conductive layer 250L. Next, a contact hole H3 is formed by etching the lower conductive layer 250L and the insulating layer 238 using the mask pattern 252 as an etch mask. The contact hole H3 exposes the impurity area 218, as well as side walls of the lower conductive layer 250L and the mask pattern 252.

The mask pattern 252 may be formed of a material having an etch selectivity different from that of the lower conductive layer 250L. For example, the mask pattern 252 may be formed of a hard mask material including oxide, nitride, or a combination thereof. Alternatively, the mask pattern 252 may be a photoresist pattern.

Figure 6:
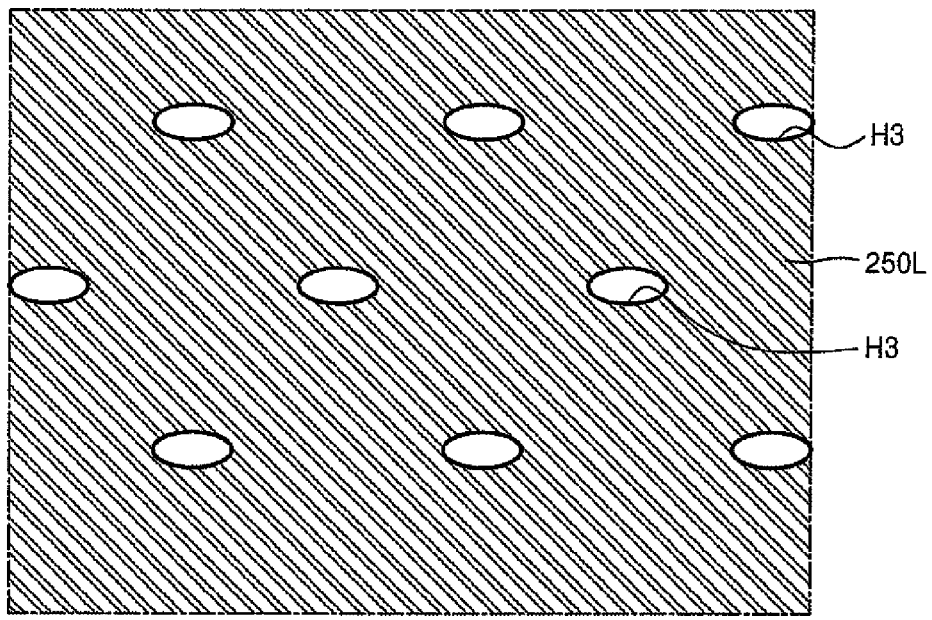
FIG. 6 is a plan view illustrating a lower conductive layer in which a contact hole is formed by operation 5B.

FIG. 6 is a plan view illustrating the lower conductive layer 250L in which the contact hole H3 is formed by the operation of FIG. 5B.

Figure 5C:
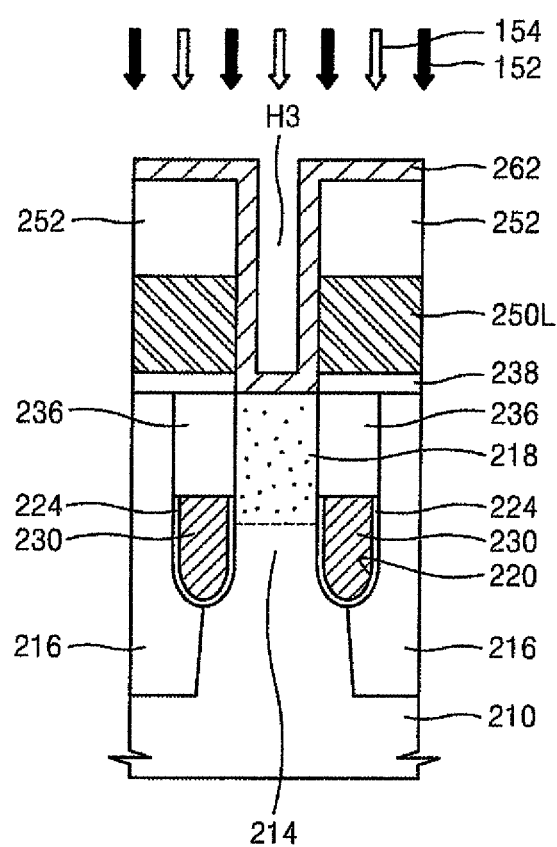

Referring to FIG. 5C, a purging process is performed by using a purging gas, such as a $N_2$ gas, on a resultant structure with the contact hole H3. The first contact conductive layer 262 is then formed in the contact hole H3.

In order to form the first contact conductive layer 262, a CVD process may be used in the same manner as described above with reference to FIG. 3C for forming the first conductive silicon layer 150, e.g., using the first silicon source 152 formed of a compound including at least two silicon atoms. The process of forming the first contact conductive layer 262 may be the same as the process for forming the first conductive silicon layer 150, described above with reference to FIG. 3C, and therefore the detailed description will not be repeated.

The first contact conductive layer 262 is formed to cover a top surface of the impurity area 218 which is exposed through the contact hole H3, the side wall of the lower conductive layer 250L which is exposed through the contact hole H3, and the side wall and a top surface of the mask pattern 252. The first contact conductive layer 262 is formed to partially fill the contact hole H3.

Because the first silicon source 152 formed of the compound including the at least two silicon atoms is supplied in order to form the first contact conductive layer 262, an abnormally large seed is not formed around an interface between the mask pattern 252 and the lower conductive layer 250L, the side walls of which are exposed through the contact hole H3. Also, the first contact conductive layer 262 formed in the contact hole H3 has excellent surface roughness.

Figure 5D:
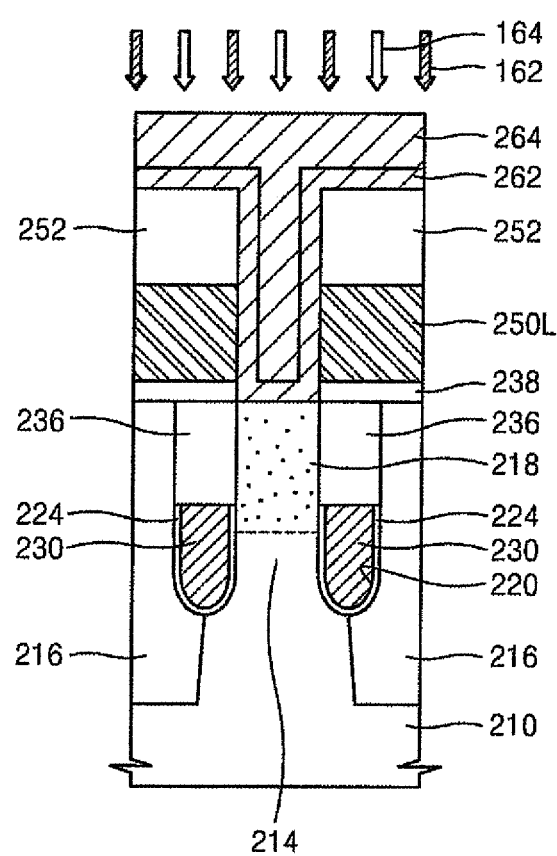

Referring to FIG. 5D, a purging process is performed by using a purging gas, such as a $N_2$ gas, on a resultant structure with the first contact conductive layer 262. The second contact conductive layer 264 is then formed on the first contact conductive layer 262 until the contact hole H3 is completely filled. The second contact conductive layer 264 fills an inner space of the contact hole H3 around an entrance to be spaced apart from the lower conductive layer 250L in which the contact hole H3 is formed.

In order to form the second contact conductive layer 264. The second silicon source 162 is formed of a compound including a number of silicon atoms which is less than the number of the silicon atoms of the compound constituting the first silicon source 152. In order to form the second contact conductive layer 264, the second silicon source 162 may be used in the same manner as described above with reference to FIG. 3C to form the second conductive silicon layer 160. The process of forming the second contact conductive layer 264 may be the same as the process for forming the second conductive silicon layer 160, described above with reference to FIG. 3D, and therefore the detailed description will not be repeated. The second contact conductive layer 264 may be formed in situ in the reaction chamber that was used to form the first contact conductive layer 262, described with reference to FIG. 5C.

Because the second contact conductive layer 264 for filling the remaining space of the contact hole H3 formed in the first contact conductive layer 262 is formed of a compound including fewer silicon atoms than the compound constituting the first silicon source 152, the second contact conductive layer 264 has excellent step coverage characteristics.

Figure 5E:
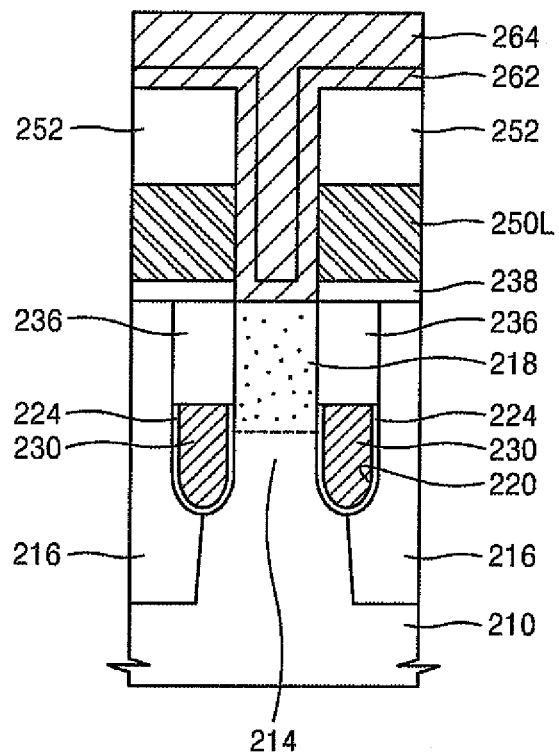

Referring to FIG. 5E, a purging process is performed by using a purging gas, such as a $N_2$ gas, on a resultant structure with the second contact conductive layer 264.

The first contact conductive layer 262 and the second contact conductive layer 264 may be in amorphous states. In this case, the first contact conductive layer 262 and the second contact conductive layer 264 may be phase-changed into polycrystalline states by performing heat treatment on the resultant structure including the first contact conductive layer 262 and the second contact conductive layer 264.

Figure 5F:
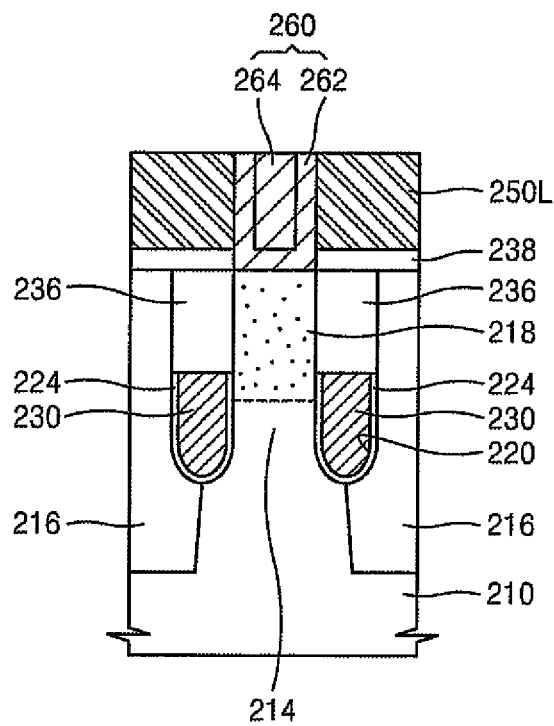

Referring to FIG. 5F, the direct contact 260 is formed by partially removing the first contact conductive layer 262 and the second contact conductive layer 264 to expose the mask pattern 252, and removing the mask pattern 252. The direct contact 260 thus includes the first contact conductive layer 262 and the second contact conductive layer 264 formed in the contact hole H3.

Partially removing of the first contact conductive layer 262 and the second contact conductive layer 264 may be performed using an etch-back process, and removing of the mask pattern 252 may be performed using a wet-etching process, for example. Alternatively, partially removing of the first contact conductive layer 262 and the second contact conductive layer 264, and removing of the mask pattern 252, may be performed by a CMP process, for example.

Because the first contact conductive layer 262, which includes the first silicon source 152 formed of the compound having at least two silicon atoms, and the second contact conductive layer 264, which includes the second silicon source 162 formed of a compound having fewer silicon atoms than the compound of the first silicon source 152, are sequentially formed in order to form the direct contact 260, the contact hole H3 is filled with a conductive material without a seam or void that would otherwise increase contact resistance.

Figure 7:
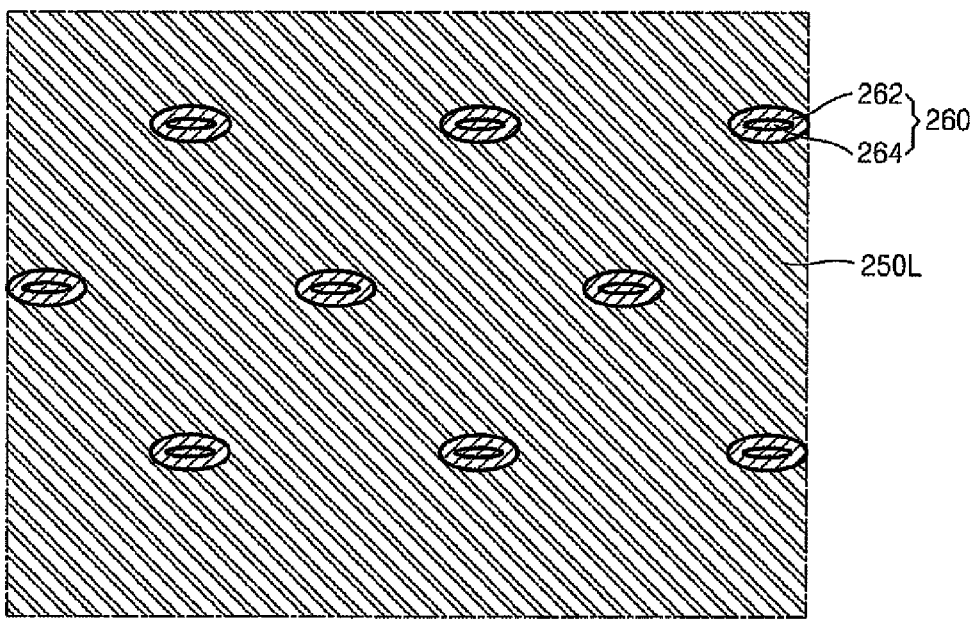
FIG. 7 is a plan view illustrating the lower conductive layer and a direct contact formed in the contact hole by operation of FIG. 5F.

FIG. 7 is a plan view of the lower conductive layer 250L and the direct contact 260 formed in the contact hole H3 by the operation of FIG. 5F.

Figure 5G:
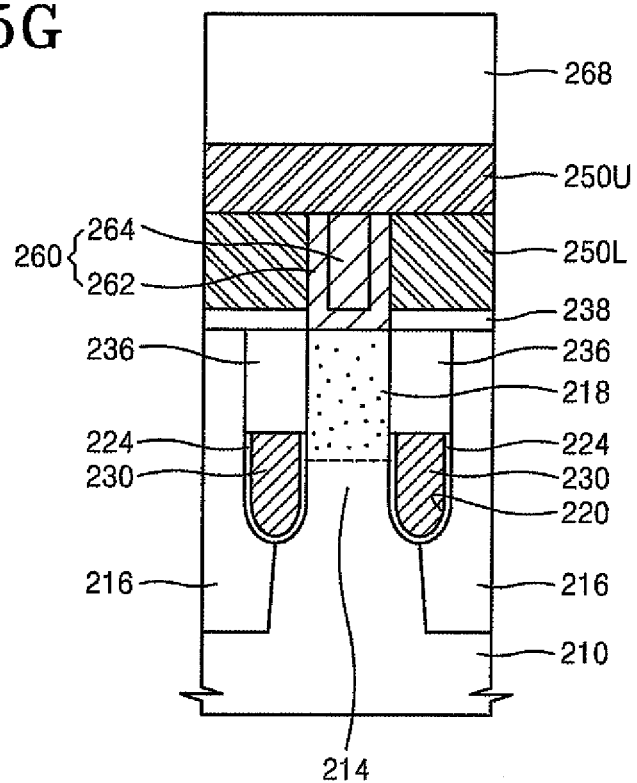

Referring to FIG. 5G, an upper conductive layer 250U is formed on the direct contact 260 and the lower conductive layer 250L to form the bit line 250. The upper conductive layer 250U may constitute the second bit line conductive pattern 250B illustrated in FIGS. 4B and 4C. The upper conductive layer 250U may be formed of a metal, such as tungsten, for example.

Next, a mask pattern 268 is formed on the upper conductive layer 250U. The upper conductive layer 250U and the lower conductive layer 250L are etched using the mask pattern 268 as an etch mask to form the bit line 250, which includes remaining portions of the lower conductive layer 250L and the upper conductive layer 250U. The bit line 250 may have a layout as illustrated in FIG. 4A, for example. The mask pattern 268 may be a hard mask pattern, for example, including a silicon nitride layer, a silicon oxide layer, or a combination thereof.

FIGS. 8A through 8G are cross-sectional views illustrating a method of manufacturing a semiconductor device, according to another embodiment of the inventive concept.

The method of FIGS. 8A through 8G including a process of forming the buried contact 280 illustrated in FIGS. 4A through 4C will now be explained. FIGS. 8A through 8G are cross-sectional views corresponding to the cross-sectional view taken along line 4C-4C' of FIG. 4. In FIGS. 8A through 8G, elements the same as those shown in FIGS. 3A through 3F, FIGS. 4A through 4C, and FIGS. 5A through 5G are denoted by the same reference numerals, respectively, and detailed explanations thereof will not be repeated.

Figure 8A:
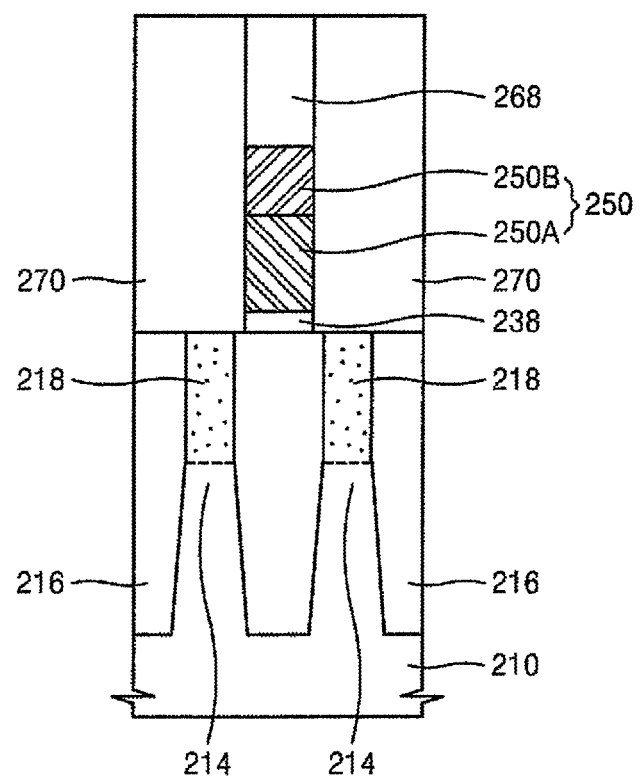
FIGS. 8A through 8G are cross-sectional views illustrating a method of manufacturing a semiconductor device, according to another embodiment of the inventive concept.

Referring to FIG. 8A, a series of operations as described with reference to FIGS. 5A through 5G are performed. Then, a space between adjacent bit lines, each covered by the mask pattern 268, is filled with the interlayer insulating layer 270.

Although a top surface of the interlayer insulating layer 270 is almost at the same level as a top surface of the mask pattern 268 in FIG. 8A, the present embodiment is not limited thereto. For example, the top surface of the interlayer insulating layer 270 may be higher than the top surface of the mask pattern 268 in terms of level.

Figure 8B:
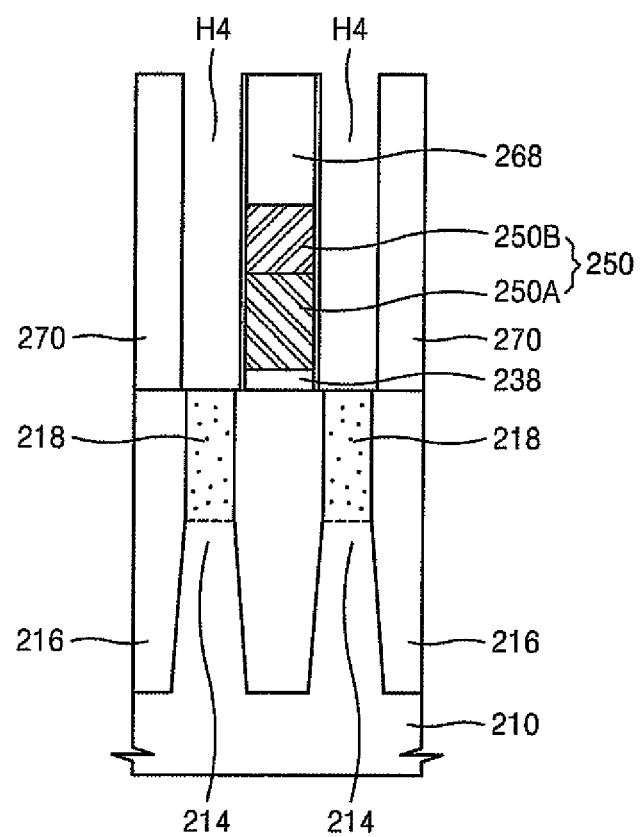

Referring to FIG. 8B, an etch mask pattern (not shown) is formed on the interlayer insulating layer 270, and then the interlayer insulating layer 270 is etched using the etch mask pattern to form multiple contact holes H4 through which multiple impurity areas 218 formed in the active areas 214 are exposed.

Figure 8C:
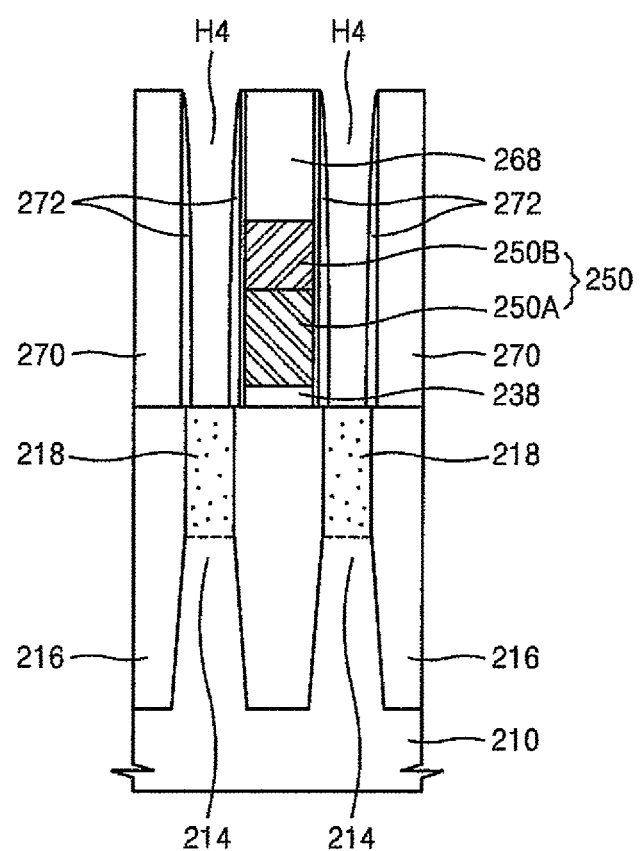

Referring to FIG. 8C, the insulating spacer 272 is formed in each contact hole H4 along a side wall of the interlayer insulating layer 270. The insulating spacer 272 prevents a short circuit between the bit line 250 and conductive material of the buried contact 280, formed in contact holes H3 in a subsequent process. The insulating spacer 272 may be formed of silicon oxide, for example. In order to form the insulating spacer 272, a silicon oxide layer is formed in the contact holes H4 and on a top surface of the interlayer insulating layer 270 in which the contact holes H4 are formed, and the silicon oxide layer is etched back to remain on side walls of the contact holes H4. The impurity area 218 is exposed through each of the contact holes H4 in which the insulating spacer 272 is formed.

Figure 8D:
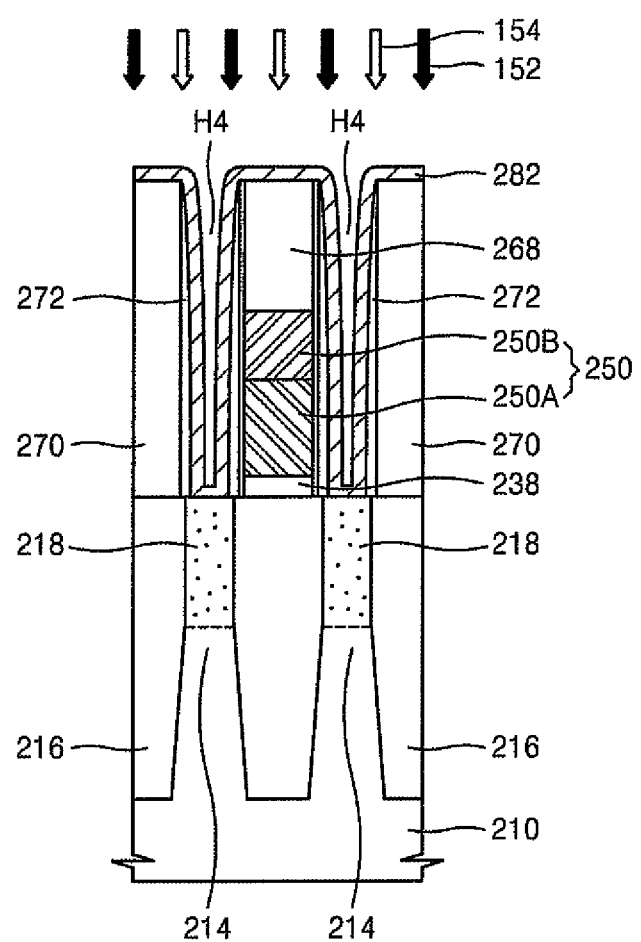

Referring to FIG. 8D, a purging process is performed by using a purging gas, such as a $N_2$ gas, on a resultant structure with the contact holes H4. The third contact conductive layer 282 is then formed in the contact holes H4. In order to form the third contact conductive layer 282, a CVD process using the first silicon source 152 formed of a compound including at least two silicon atoms may be used in the same manner as used to form the first conductive silicon layer 150. Thus, the process for forming the third contact conductive layer 282 may be the same as the process for fanning the first conductive silicon layer 150, discussed above with reference to FIG. 3C.

The third contact conductive layer 282 is formed to cover a top surface of the impurity areas 218 exposed through each of the contact holes H4, a side wall of the insulating spacer 272 exposed through the contact hole 114, and a top surface of the interlayer insulating layer 270. The third contact conductive layer 282 is formed to partially fill the contact hole H4.

Because the first silicon source 152 formed of the compound including the at least two silicon atoms is supplied to form the third contact conductive layer 282, the third contact conductive layer 282 formed in the contact holes H4 has excellent surface roughness.

Figure 8E:
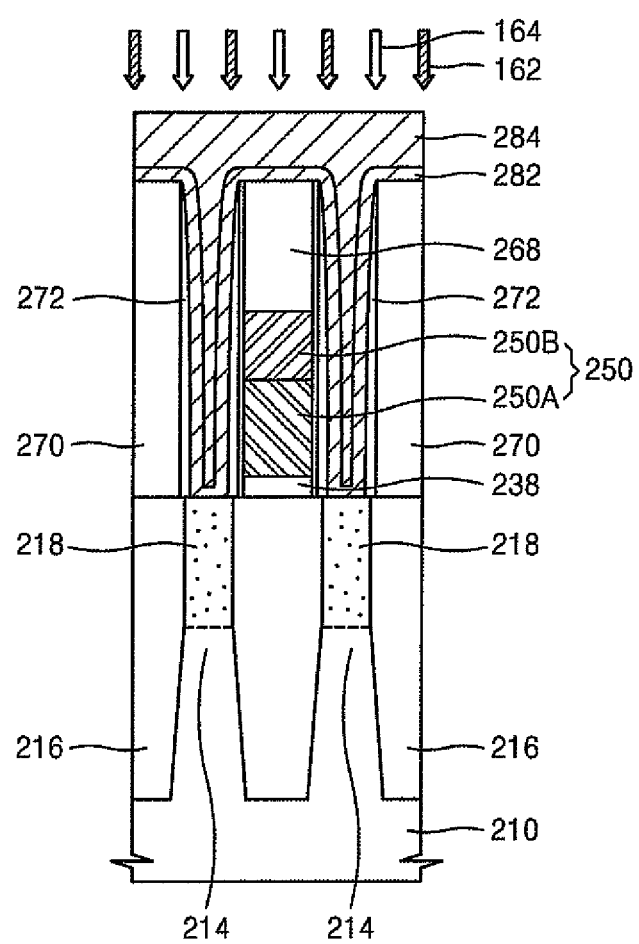

Referring to FIG. 8E, a purging process is performed by using a purging gas, such as a $N_2$ gas, on a resultant structure with the third contact conductive layer 282. The fourth contact conductive layer 284 is formed on the third contact conductive layer 282 until the contact hole H4 is completely filled.

In order to form the fourth contact conductive layer 284, the second silicon source 162, formed of a compound having fewer silicon atoms than the compound constituting the first silicon source 152, may be used in the same manner as used to form the second conductive silicon layer 160. Thus, the process for forming the fourth contact conductive layer 284 may be the same as the process for forming the second conductive silicon layer 160, discussed above with reference to FIG. 3D. The fourth contact conductive layer 284 may be formed in situ in the reaction chamber that was used to form the third contact conductive layer 282, described above with reference to FIG. 8D.

Because the fourth contact conductive layer 284 for filling a remaining space of the contact holes H4 in the third contact conductive layer 282 is formed using the second silicon source 162, which is the compound including fewer silicon atoms than the compound constituting the first silicon source 152, the fourth contact conductive layer 284 has excellent step coverage characteristics.

Figure 8F:
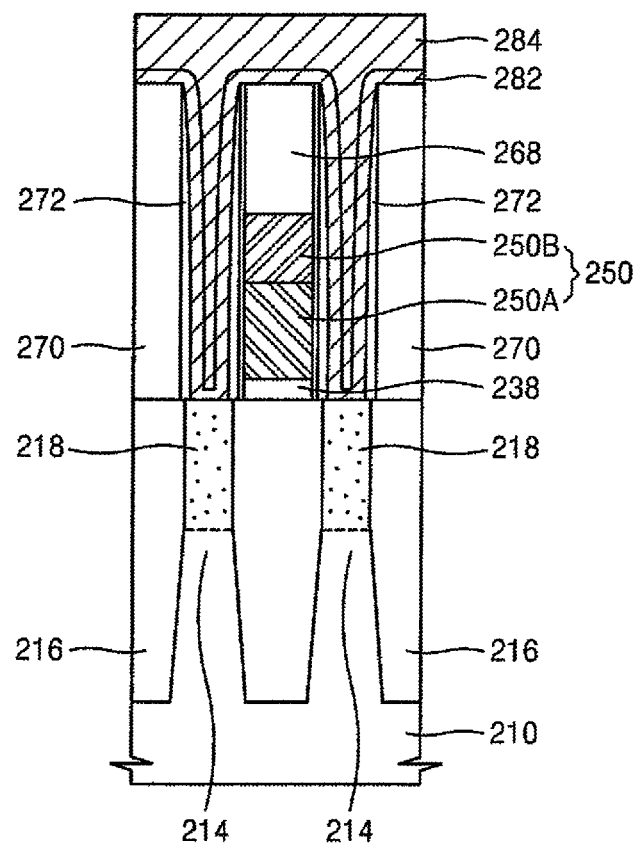

Referring to FIG. 8F, a purging process is performed by using purging gas, such as a $N_2$ gas, on a resultant structure with the fourth contact conductive layer 284. The third contact conductive layer 282 and the fourth contact conductive layer 284 may be in amorphous states. In this case, the third contact conductive layer 282 and the fourth contact conductive layer 284 may be phase-changed into polycrystalline states by performing heat treatment on the resultant structure, including the third contact conductive layer 282 and the fourth contact conductive layer 284.

Figure 8G:
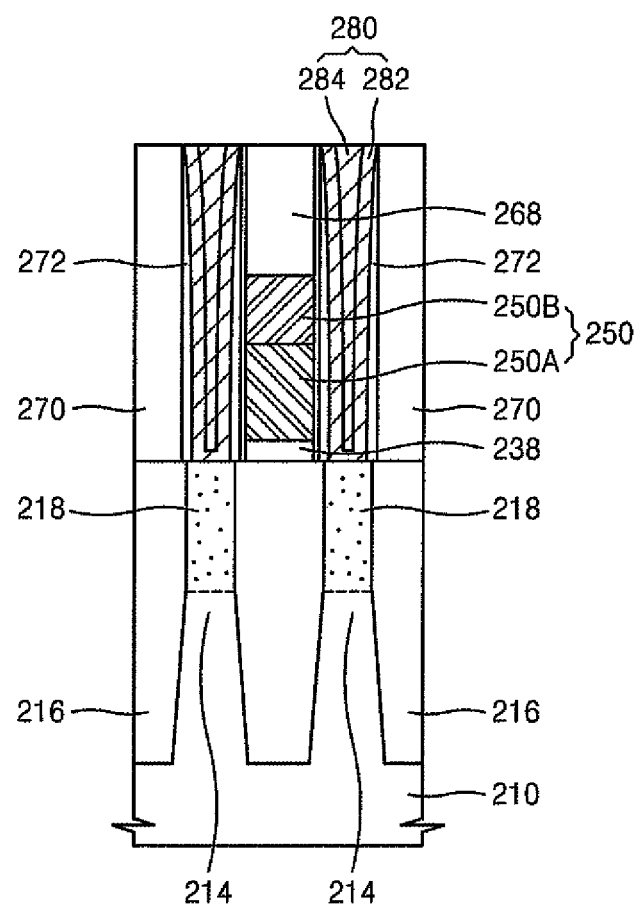

Referring to FIG. 8G, the third contact conductive layer 282 and the fourth contact conductive layer 284 are partially removed from the substrate 210 to expose the interlayer insulating layer 270. As a result, the buried contact 280 including remaining portions of the third contact conductive layer 282 and the fourth contact conductive layer 284 which fill the contact holes H4 is formed. The partially removing of the third contact conductive layer 282 and the fourth contact conductive layer 284 may be performed by an etch-back process or a CMP process, for example.

Because the second contact conductive layer 282, obtained using the first silicon source 152 formed of the compound including the at least two silicon atoms, and the fourth contact conductive layer 284, obtained using the second silicon source formed of the compound including fewer silicon atoms than the compound constituting the first silicon source 152, are sequentially formed in order to form the buried contact 280, the contact holes H4 are filled with conductive materials without seams or voids that would increase contact resistance.

Figure 9:
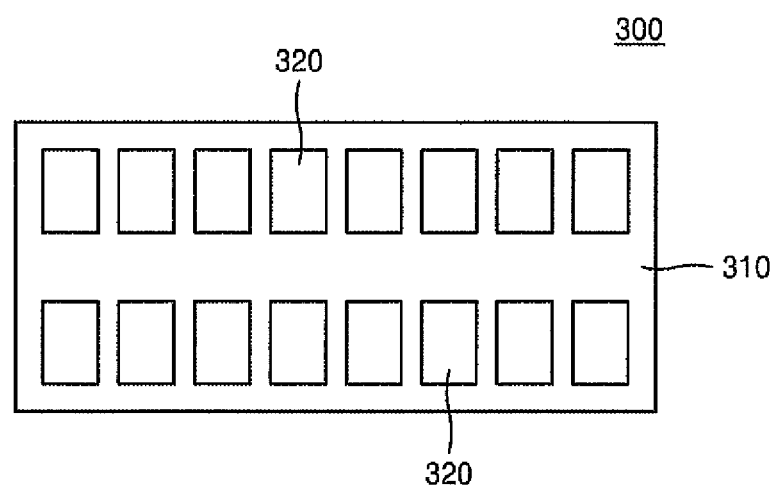
FIG. 9 is a plan view of a memory module including a semiconductor device, according to an embodiment of the inventive concept.

FIG. 9 is a plan view of a memory module 300 including a semiconductor device, according to an embodiment of the inventive concept.

The memory module 300 includes a printed circuit board 310 and multiple semiconductor packages 320. The semiconductor packages 320 includes semiconductor devices manufactured according to the methods described above, for example. That is, the semiconductor packages 320 may include semiconductor devices manufactured by the methods described with reference to FIGS. 3A through 3F, FIGS. 4A through 4C, FIGS. 5A through 5G, FIG. 6, FIG. 7, and FIGS. 8A through 8G.

The memory module 300 may be a single in-line memory module (SIMM), in which the semiconductor packages 320 are arranged on only one surface of the printed circuit board 310, or a dual in-line memory module (DIMM), in which the semiconductor packages 320 are arranged on both surfaces of the printed circuit board 310. The memory module 300 may be a fully buffered DIMM (FBDIMM) having an advanced memory buffer (AMB) for respectively providing external signals to the semiconductor packages 320.

Figure 10:
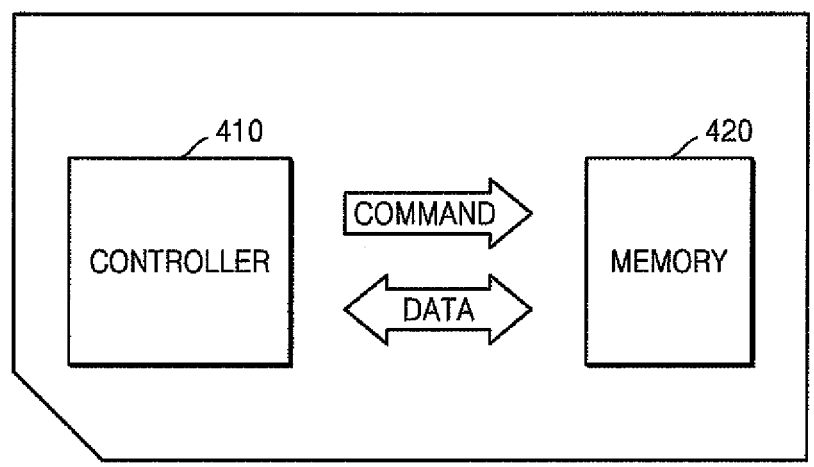
FIG. 10 is a block diagram of a memory card including a semiconductor device, according to an embodiment of the inventive concept.

FIG. 10 is a block diagram of a memory card 400 including a semiconductor device, according to an embodiment of the inventive concept.

The memory card 400 may be configured such that a controller 410 and a memory 420 exchange an electrical signal. For example, when the controller 410 outputs a command to the memory 420, the memory 420 may transmit data.

The memory 420 may include semiconductor devices manufactured according to the methods described above, for example. That is, the memory 420 may include semiconductor devices manufactured by the methods described with reference to FIGS. 3A through 3F, FIGS. 4A through 4C, FIGS. 5A through 5G, FIG. 6, FIG. 7, and FIGS. 8A through 8G.

The memory card 400 may be any of various types of memory cards, such as a memory stick card, a smart media (SM) card, a secure digital (SD) card, a mini-SD card, and a multimedia card (MMC).

Figure 11:
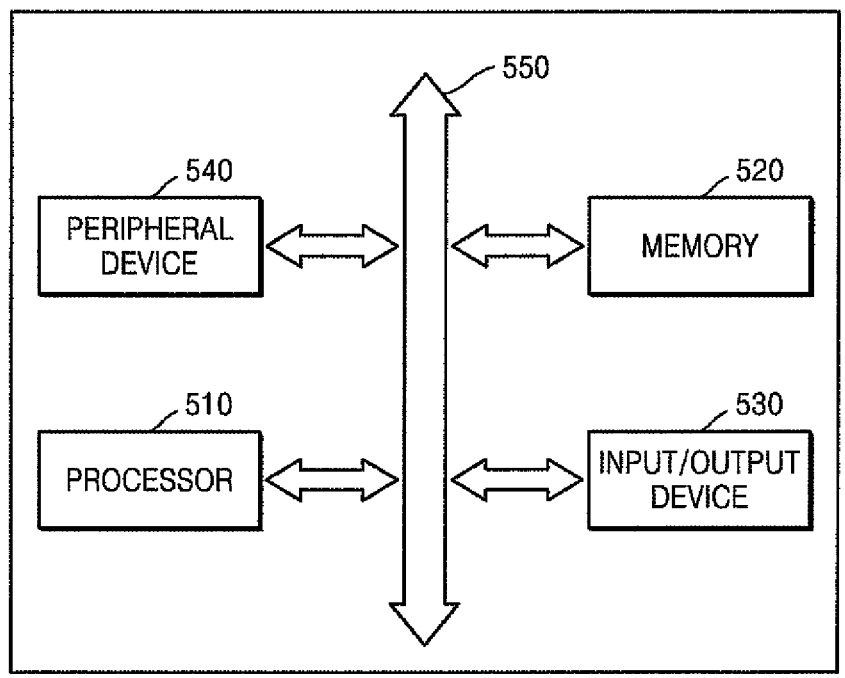
FIG. 11 is a block diagram of a system including a semiconductor device, according to an embodiment of the inventive concept.

FIG. 11 is a system 500 including a semiconductor device, according to an embodiment of the inventive concept.

The system 500 includes a processor 510, an input/output device 530, and a memory 520. The processor 510, the input/output device 530, and the memory 520 may communicate data with one another via a bus 550. The memory 520 of the system 500 may be a random access memory (RAM) or a read-only memory (ROM). The system 500 may further include a peripheral device 540, such as a floppy disk drive or a compact disk (CD) ROM drive.

The memory 520 may include semiconductor devices manufactured according to the methods described above, for example. That is, the memory 520 may include semiconductor devices manufactured by the methods described with reference to FIGS. 3A through 3F, FIGS. 4A through 4C, FIGS. 5A through 5G, FIG. 6, FIG. 7, and FIGS. 8A through 8G. The memory 520 may store code and data in order to operate the processor 510.

The system 500 may be used in various types of electronic devices, such as a mobile phone, an MP3 player, a navigation system, a portable multimedia player (PMP), a solid-state disk (SSD), or a household appliance.

As described above, a contact hole in a semiconductor device is filled with a conductive material to form a contact plug, which is small enough to scale down a semiconductor device, without forming a seam or void that would increase contact resistance. Thus, the electric characteristics of the contact plug, as well as the reliability of the semiconductor device, are improved.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of manufacturing a semiconductor device, the method comprising:

forming a first pattern having a contact hole through which a top surface of a conductive area of a semiconductor substrate is exposed, wherein the first pattern comprises a conductive layer of polysilicon and a mask pattern of electrically insulative material directly on the conductive layer of polysilicon;

forming a conformal first silicon layer on the exposed top surface of the conductive area and directly on a side wall surface of the first pattern including across an interface between the conductive layer and the mask pattern, wherein the first silicon layer is formed in contact with a side wall surface of the conductive pattern and with a sidewall surface of the mask pattern to fill part of the contact hole, the first silicon layer being formed using a first compound whose chemical formula contains at least two silicon atoms;

forming a second silicon layer on the first silicon layer to fill the remainder of the contact hole, the second silicon layer being formed using a second compound whose chemical formula contains fewer silicon atoms than that of the first compound;

removing portions of the first silicon layer and the second silicon layer and removing the mask pattern to form a contact plug comprising portions of the first silicon layer and the second silicon layer remaining in the contact hole.

2. The method of claim 1, wherein the chemical formula of the first compound is represented by $Si_nH_{2n+2}$, wherein n is a natural number satisfying $2 \leq n \leq 10$.

3. The method of claim 1, wherein the first compound is $Si_2H_6$, and the second compound is $SiH_4$.

4. The method of claim 1, wherein each of the first silicon layer and the second silicon layer is formed by chemical vapor deposition (CVD).

5. The method of claim 1, wherein forming the first silicon layer comprises forming the first silicon layer at a first temperature selected from temperatures in a range of about 350° C. to about 550° C., and
wherein forming the second silicon layer comprises forming the second silicon layer at a second temperature higher than the first temperature.

6. The method of claim 1, wherein the first silicon layer is formed in contact with the conductive area.

7. The method of claim 1, further comprising:
forming a conductive layer covering the contact plug and the first pattern.

8. The method of claim 1, wherein the mask pattern comprises an oxide layer directly on the conductive pattern of polysilicon such that the first silicon layer crosses an interface between the conductive pattern and the oxide layer.

9. The method of claim 4, wherein forming the second silicon layer comprises forming the second silicon layer in situ in a reaction chamber used to form the first silicon layer.

10. The method of claim 4, wherein forming the first silicon layer comprises simultaneously supplying the first compound and a first dopant source, and
wherein forming the second silicon layer comprises simultaneously supplying the second compound and a second dopant source.

11. A method of manufacturing a semiconductor device, the method comprising:
forming a conductive polysilicon layer on a semiconductor substrate having a conductive area;
forming a mask pattern directly on the conductive polysilicon layer;
etching the conductive polysilicon layer using the mask pattern as an etch mask to form a contact hole through which the conductive area is exposed;
forming a conformal first contact conductive layer directly on the mask pattern and the conductive polysilicon layer, and on the conductive area exposed through the contact hole using a chemical vapor deposition (CVD) process using a first dopant source and a first silicon source formed of a compound whose chemical formula contains at least two silicon atoms, wherein the first contact conductive layer fills part of the contact hole and extends across an interface between the conductive polysilicon layer and the mask pattern within the contact hole;
forming a second contact conductive layer on the first contact conductive layer, filling the remainder of the contact hole including space around an entrance of the contact hole, using a CVD process using a second dopant source and a second silicon source formed of a compound whose chemical formula contains fewer silicon atoms than that of the compound of the first silicon source; and
removing portions of the first contact conductive layer and the second contact conductive layer and removing the mask pattern to form a contact plug comprising portions of the first contact conductive layer and the second contact conductive layer remaining in the contact hole.

12. The method of claim 11, wherein the first silicon source is represented by $Si_nH_{2n+2}$, wherein n is a natural number satisfying $2 \leq n \leq 10$; and
the second silicon source is represented by $Si_nH_{2n+2}$, wherein n is a natural number satisfying $1 \leq n \leq 10$.

13. The method of claim 11, wherein the chemical formula of the first silicon source is $Si_2H_6$, and the chemical formula of the second silicon source is $SiH_4$.

14. The method of claim 11, wherein the first contact conductive layer is formed in the contact hole in contact with the conductive area and the conductive polysilicon layer.

15. The method of claim 11, further comprising:
forming a conductive layer covering the contact plug and the first contact conductive layer.

16. The method of claim 11, wherein forming the mask pattern comprises forming an oxide layer directly on the conductive pattern of polysilicon, and the first silicon layer crosses an interface between the conductive pattern and the oxide layer.

* * * * *